(12) United States Patent
Ikeda (10) Patent No.: US 7,608,477 B2
(45) Date of Patent: Oct. 27, 2009

(54) PROCESS FOR SUBSTRATE INCORPORATING COMPONENT

(75) Inventor: Haruhiko Ikeda, Omihachiman (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 262 days.

(21) Appl. No.: 10/560,223

(22) PCT Filed: Mar. 26, 2004

(86) PCT No.: PCT/JP2004/004380

§ 371 (c)(1), (2), (4) Date: Dec. 12, 2005

(87) PCT Pub. No.: WO2005/004567

PCT Pub. Date: Jan. 13, 2005

(65) Prior Publication Data

US 2006/0134907 A1    Jun. 22, 2006

(30) Foreign Application Priority Data

Jul. 4, 2003    (JP)    ............................. 2003-191571

(51) Int. Cl.
*H01L 21/00* (2006.01)

(52) U.S. Cl. ...................... 438/106; 438/107; 361/762; 257/E25.013

(58) Field of Classification Search .................. 174/255, 174/258, 263; 438/106–108; 361/760–764; 257/E21.512, E21.48
See application file for complete search history.

(56) References Cited

U.S. PATENT DOCUMENTS 5,877,550 A * 3/1999 Suzuki ........................ 257/700

6,625,037 B2 * 9/2003 Nakatani et al. ............ 361/762

(Continued)

FOREIGN PATENT DOCUMENTS

JP    2002-076637    3/2002

(Continued)

OTHER PUBLICATIONS

International Search Report for PCT Application No. PCT/JP2004/004380. International filing date Mar. 26, 2004; mailing date Jul. 13, 2004.

*Primary Examiner*—W. David Coleman
*Assistant Examiner*—Shaka Scarlett
(74) *Attorney, Agent, or Firm*—Keating & Bennett, LLP (57) ABSTRACT

In a process for producing the component-embedded substrate, a first electronic component is connected and fixed onto a first electrode pattern with a conductive bonding material, the first electrode pattern being provided on a first supporting layer. A second supporting layer including a second electrode pattern is press-bonded onto the electronic component-fixed surface of the first supporting layer with a first prepreg therebetween to perform transfer. Then, the first supporting layer and the second supporting layer are separated from the first prepreg. After separation, the first prepreg is cured. A second electronic component is connected and fixed onto the back surface of the second electrode pattern with a conductive bonding material. A third supporting layer including a third electrode pattern is press-bonded onto the second electronic component-fixed surface with a second prepreg therebetween to perform transfer. Then, the third supporting layer is separated from the second prepreg, and the second prepreg is cured. In this manner, the prepregs and electrode patterns are sequentially laminated, thereby reducing the connection resistance between laminated electrode patterns or between an electrode pattern and an electronic component.

8 Claims, 6 Drawing Sheets

U.S. PATENT DOCUMENTS

| | | | |
|---|---|---|---|
| 6,931,725 B2 * | 8/2005 | Sugaya et al. | 29/852 |
| 2005/0118750 A1 * | 6/2005 | Baba et al. | 438/128 |
| 2005/0186768 A1 * | 8/2005 | Sugaya et al. | 438/597 |

FOREIGN PATENT DOCUMENTS

| | | |
|---|---|---|
| JP | 2002-261449 | 9/2002 |
| JP | 2003-133743 | 5/2003 |

* cited by examiner

PROCESS FOR SUBSTRATE INCORPORATING COMPONENT

BACKGROUND OF THE INVENTION

1. Field of the Invention

The present invention relates to a process for producing a substrate including therein an electronic component, such as a semiconductor element and a chip component.

2. Description of the Related Art

Demands for miniaturization and higher performance of electronic devices require a further reduction in the profile of components having a smaller mounting area. To meet such requirements, a component-embedded substrate is known in which multiple resin layers including a semiconductor element and a chip component therein are laminated.

Patent Document 1 (Japanese Unexamined Patent Application Publication No. 2002-76637) discloses a process for producing the component-embedded substrate by press-bonding and transferring a supporting layer including a component-connected electrode pattern onto one surface of a prepreg, and then laminating the resulting prepreg with another prepreg in which a component is embedded by press bonding in a single step.

Figure 8:
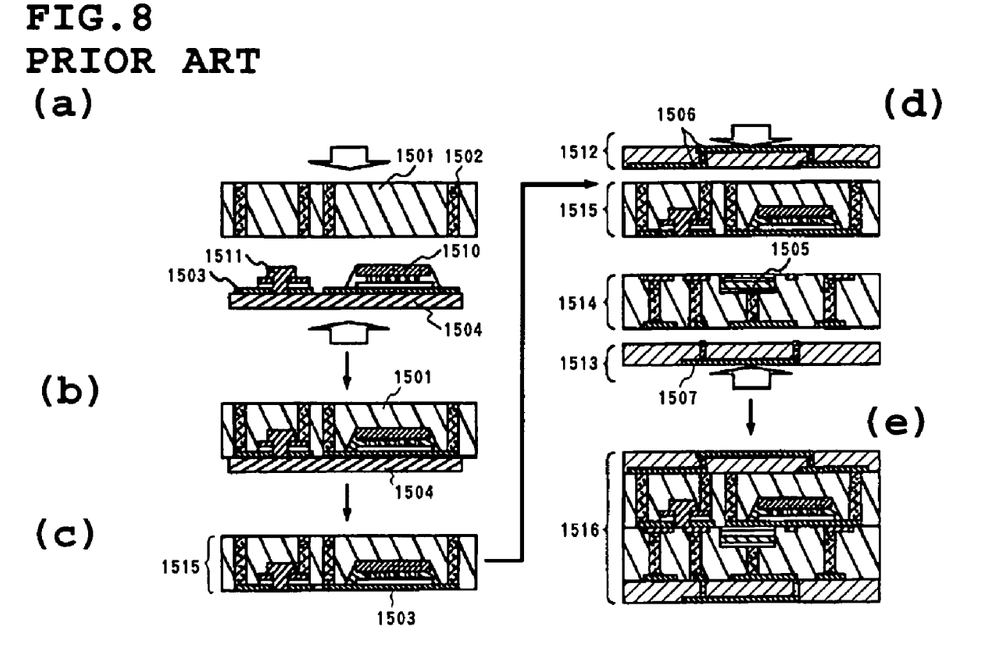
FIG. 8 is a process chart for producing a conventional component-embedded substrate.

FIG. 8 is an example shown in FIG. 15 in Patent Document 1. In step (a), a prepreg 1501 including via holes 1502 and a supporting layer 1504 including an electrode pattern on which electronic components 1510 and 1511 are connected are prepared. In step (b), the prepreg 1501 and the supporting layer 1504 are laminated by press bonding. In step (c), the supporting layer 1504 is separated to form a wiring layer 1515. In step (d), the wiring layer 1515, another wiring layer 1514 in which an electronic component 1505 is embedded, wiring layers 1512 and 1513 including an electrode pattern 1506 and an interlayer via 1507, respectively, are laminated by press bonding in a single step to form a multilayer component-embedded substrate 1516 as shown in (e).

However, in such a single-step lamination process, at the interlayer between the laminated prepregs, an electrode pattern transferred on the surfaces of the prepregs is only in contact with another electrode pattern or an electronic component to provide an electrical connection. Thus, the connection resistance is disadvantageously increased, which results in insufficient connection reliability. Furthermore, since two electrode layers are disposed between the laminated prepregs, the bonding strength between the prepregs is low, thus possibly causing delamination.

To overcome these problems, in FIG. 16 in Patent Document 1, discloses a process in which a prepreg defining an adhesive layer including a through hole is provided between the cured resin layers to ensure the connection reliability between the electrode patterns or between the electrode pattern and the electronic component. However, this process disadvantageously requires an interlayer prepreg including no component. Thus, the thickness of the component-embedded substrate is increased.

SUMMARY OF THE INVENTION

To overcome the problems described above, preferred embodiments of the present invention provide a process for producing a component-embedded substrate having low connection resistance between laminated electrode patterns or between an electrode pattern and an electronic component, the electrode pattern and the electronic component being laminated, and having improved connection reliability.

According to another preferred embodiments of the present invention, when electronic components are connected onto front and back surfaces of an inner layer electrode, a process is provided for producing a component-embedded substrate having improved connection reliability between the inner layer electrode and the electronic components.

According to a first preferred embodiment of the present invention, a process is provided for producing a component-embedded substrate, including the steps of connecting and fixing a first electronic component to a first electrode pattern on a first supporting layer with a conductive bonding material, press-bonding a second supporting layer including a second electrode pattern onto the electronic component-fixed surface of the first supporting layer with a first prepreg therebetween to perform transfer, separating the first supporting layer and the second supporting layer from the first prepreg, curing the first prepreg before or after the separating step, connecting and fixing a second electronic component onto the back surface of the second electrode pattern with a conductive bonding material, press-bonding a third supporting layer including a third electrode pattern onto a second electronic component-fixed surface with a second prepreg therebetween to perform transfer, separating the third supporting layer from the second prepreg, and curing the second prepreg before or after the separating step, wherein the prepregs and the electrode patterns are sequentially laminated.

According to a second preferred embodiment of the present invention, a process is provided for producing a component-embedded substrate including the steps of connecting and fixing a first electronic component on the surface of an electrode pattern on a supporting layer with a conductive bonding material, press-bonding a first prepreg onto the first electronic component-fixed surface of the supporting layer, separating the supporting layer from the first prepreg, curing the first prepreg before or after the separating step, connecting and fixing a second electronic component onto the back surface of the electrode pattern with a conductive bonding material, press-bonding a second prepreg onto the second electronic component-fixed surface, and curing the second prepreg.

According to a third preferred embodiment of the present invention, a process is provided for producing a component-embedded substrate including the steps of connecting and fixing a first electronic component onto the surface of a first electrode pattern on a first supporting layer with a conductive bonding material, press-bonding a second supporting layer including a second electrode pattern onto the electronic component-fixed surface of the first supporting layer with a first prepreg therebetween to perform transfer, separating the first supporting layer and the second supporting layer from the first prepreg, curing the first prepreg before or after the separating step, connecting and fixing a second electronic component onto the back surface of the first electrode pattern with a conductive bonding material, press-bonding a third supporting layer including a third electrode pattern onto a second electronic component-fixed surface with a second prepreg therebetween to perform transfer, separating the third supporting layer from the second prepreg, and curing the second prepreg before or after the separating step, wherein the prepregs and the electrode patterns are sequentially laminated.

According to the first preferred embodiment of the present invention, a plurality of layers are not laminated in a single step, but instead, are sequentially laminated. The first electronic component is connected and fixed onto the first electrode pattern with the conductive bonding material. The first electrode pattern is integrally press-bonded to the second electrode pattern with the first prepreg therebetween. In this preferred embodiment, a process for transferring the electrode patterns by forming the electrode patterns on the supporting layers, press-bonding the resulting electrode patterns to the prepregs, and then performing separation is preferably used. Next, the second electronic component is connected and fixed onto the back surface of the second electrode pattern with the conductive bonding material. The third electrode pattern is press-bonded and transferred onto the resulting second electrode pattern with the second prepreg therebetween.

In this manner, by sequentially laminating the prepregs and the electrode patterns, a component-embedded substrate having a multilayer structure is produced.

The electrode pattern is connected to the electronic component with the conductive bonding material (solder, a conductive adhesive, a bump, or the like), thus reducing connection resistance between the electrode pattern and the electronic component and achieving high connection reliability.

According to the first preferred embodiment, the electrode pattern is transferred to the prepreg. After curing this prepreg, the next prepreg is press-bonded simultaneously with the transfer of the electrode pattern to the surface. Consequently, the resulting inner layer electrode between the prepregs (resin layers) is a single layer and is different from the conventional structure having two inner layer electrodes. Therefore, it is unnecessary to contact and electrically connect the inner layer electrodes to each other. Furthermore, the occurrence of delamination between the inner layer electrodes is prevented.

The electrode pattern is transferred to the prepreg, and after curing this prepreg, the next prepreg is laminated. Thus, the first prepreg is not compressed during every lamination, and no problems, such as the poor electrical connection of the electrical component embedded in the first prepreg or the deformation of the electrode pattern, occur.

Curing of the prepreg may be performed before or after separation of the supporting layer.

According to the second preferred embodiment of the present invention, when the electronic components are connected onto the front and back surfaces of the inner layer electrode, the process is provided in which the electronic component is connected and fixed onto the surface of the electrode pattern with the conductive bonding material, this is transferred to the first prepreg, the first prepreg is cured, the second electronic component is connected and fixed onto the back surface of the electrode pattern with the conductive bonding material, and the second prepreg is press-bonded thereon.

Conventionally, when electronic components are connected onto the front and back surfaces of an inner layer electrode, the electrodes of the electronic components must be brought into contact with and electrically connected to the inner layer electrode, which results in low conduction reliability and high connection resistance between the component electrodes and the inner layer electrode. In contrast, according to the second preferred embodiment, not only is lamination sequentially performed one layer at a time, but the second electronic component is also connected and fixed onto the back surface of the first electrode pattern with the conducive bonding material, the first electrode pattern connecting and fixing the first electronic component on the front surface with the conducive bonding material, thus resulting in high conduction reliability and low connection resistance between the inner layer electrode and the electronic component.

In addition, after curing the first prepreg, the second prepreg is press-bonded in a similar manner to the first preferred embodiment. Thus, the deviation and the breakage of the electrode pattern transferred to the first prepreg and a poor connection between the electronic component and the electrode pattern are prevented. Furthermore, the delamination between the prepregs does not occur.

According to the third preferred embodiment, in the step of press-bonding the first prepreg and the second prepreg in the process according to the second preferred embodiment, a substep of disposing the supporting layer having the electrode pattern on the surface opposite the press-bonded surface of the prepreg and then press-bonding this supporting layer to the prepreg simultaneously with the above-described press-bonding step is included, and after the press-bonding substep, the second supporting layer is separated from the prepreg to transfer the electrode pattern to the prepreg.

In the process according to the second preferred embodiment, when the electrode pattern is provided on the surface opposite the press-bonded surface of the prepreg, a process of separately forming a thick-film electrode pattern or a thin-film electrode pattern after curing the prepreg is provided. This disadvantageously increases the number of steps.

Accordingly, in the process according to the third preferred embodiment, by simultaneously transferring the electrode patterns to both of the front and back surfaces, it is unnecessary to form a new electrode pattern after press-bonding the prepreg. Therefore, the number of steps is reduced.

According to a fourth preferred embodiment, the process preferably further includes the steps of forming a through hole in the resin layer in the thickness direction after curing the prepreg, and forming a conducting path inside the hole, the conducting path electrically connecting the electrode patterns provided on the front surface and the back surface of the resin layer.

Conventionally (in Patent Document 1), a through hole is formed in a prepreg and is then filled with a conducting material. After performing lamination, the prepreg is thermally cured. However, during the thermal curing, the contraction of the prepreg due to curing may cause a deviation of the position of the electrode pattern being in contact with the through hole, thus possibly reducing connection reliability.

In contrast, in accordance with the fourth preferred embodiment, after curing the prepreg, a hole (a through hole or a via hole) is provided, and a conducting path is formed inside the hole. Therefore, it is possible to securely connect the hole with the electrode patterns without any positional deviation of the electrode patterns on the front and back surfaces of the resin layer.

As a process for forming the conducting path, the inner surface of the hole may be plated. Alternatively, the conducting path may be formed by filling the inside of the hole with a conducting paste and then curing the paste.

According to a fifth preferred embodiment, the process preferably further includes the steps of forming the hole connecting the electrode pattern provided on the front surface or the back surface of the resin layer with the external electrode of the electronic component after curing the prepreg, and forming the conducting path inside the hole, the conducting path electrically connecting the electrode pattern with the external electrode of the electronic component.

In accordance with the fourth preferred embodiment, the electrode patterns on the front and back surfaces of the resin layer are connected to each other. On the other hand, in accordance with the fifth preferred embodiment, one of the electrode patterns is directly connected to the external electrode of the electronic component. The wiring resistance of the through holes and via holes is higher than that of usual copper wiring. Therefore, the hole desirably has the minimal length. In this case, since the length of the hole is reduced by the thickness of the component, the resistance of the conducting path is advantageously reduced.

In accordance with a sixth preferred embodiment, the step of curing the prepreg preferably includes a substep of performing temporary curing before separating the supporting layer from the prepreg, and performing complete curing after separating the supporting layer from the prepreg.

When the supporting layer is separated without curing the prepreg, problems, such as difficulty in the separation of the supporting layer or breakage of the prepreg, may occur because of the adhesion between the prepreg and the supporting layer. In contrast, performing temporary curing before separating the supporting layer from the prepreg facilitates separation of the supporting layer from the prepreg while deformation of the prepreg is prevented.

When the next prepreg is laminated in the temporarily cured state, the prepreg being in the temporarily cured state may be deformed by compression. Therefore, complete curing should be performed before the lamination of the next prepreg.

When an epoxy resin is used in the prepreg, as the temporary curing conditions, for example, heat treatment should be performed at about 120° C. for about 10 to 15 minutes. As the complete curing conditions, heat treatment should be performed at about 170° C. to about 200° C. for about 1 hour.

In accordance with a seventh preferred embodiment, after curing the second prepreg, a step of press-bonding a fourth supporting layer having a fourth electrode pattern onto the surface of the first prepreg with a third prepreg therebetween to perform transfer, the surface being opposite to the surface bonded to the second prepreg, a step of separating the fourth supporting layer from the third prepreg, and curing the prepreg before or after the separating step, are preferably provided.

When three or more prepregs are laminated, a process of laminating a second prepreg defining a second layer on a first prepreg defining a first layer and then laminating a third prepreg defining a third layer on the second layer prepreg is preferable. However, the first resin layer (prepreg) is warped toward the second layer prepreg by the contraction of the second layer prepreg during curing. Thus, when the third layer prepreg is laminated thereon, the resulting laminate is further warped by the contraction of the third layer prepreg during curing.

Accordingly, in the seventh preferred embodiment, when the second layer prepreg is laminated on the first layer prepreg, the third layer prepreg is not laminated on the second layer prepreg, but rather, on the first layer prepreg. As a result, the influence of the warpage caused by the contraction of the second layer prepreg during curing is compensated by the contraction of the third layer prepreg during curing, thereby resulting in a laminate reduced warpage.

Other features, elements, steps, advantages and characteristics of the present invention will become more apparent from the following detailed description of preferred embodiments thereof with reference to the attached drawings.

DETAILED DESCRIPTION OF PREFERRED EMBODIMENTS

Figure 1:
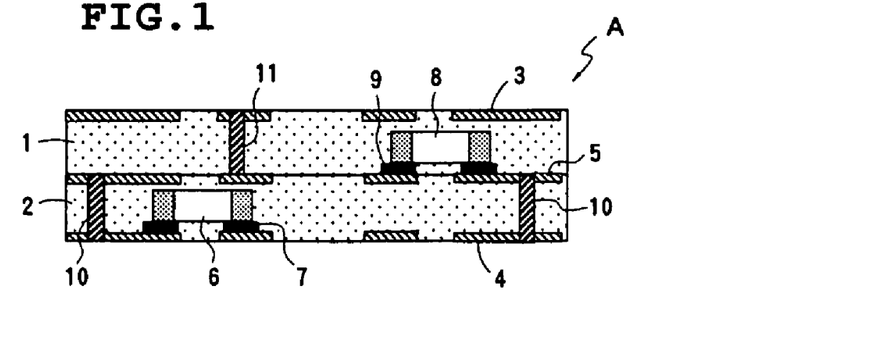
FIG. 1 is a cross-sectional view of a component-embedded substrate produced by a production process according to a first preferred embodiment of the present invention.

FIG. 1 shows a component-embedded substrate A produced by a process according to a first preferred embodiment of the present invention.

In FIG. 1, reference numerals 1 and 2 represent resin layers defining the substrate. Patterned outer layer electrodes 3 and 4 are provided on the front and back surfaces of the resin layers 1 and 2, respectively. A patterned inner layer electrode 5 is provided between the resin layers 1 and 2. An electronic component 6 is connected and fixed onto the inner surface of the outer layer electrode 4, which is provided on the lower side, with a conductive bonding material 7. An electronic component 8 is connected and fixed onto the upper surface of the inner layer electrode 5 with a conductive bonding material 9. As the conductive bonding materials 7 and 9, solder, conducting adhesives, bumps, or other suitable conductive bonding materials are preferably used. The outer layer electrode 4, which is provided on the lower side, is appropriately connected to the inner layer electrode 5 through a via hole 10 filled with a conducting material. The outer layer electrode 3, which is provided on the upper side, is connected to the inner layer electrode 5 through a via hole 11.

The via holes 10 and 11 each have a diameter of, for example, about 100 μm to about 500 μm and a length of about 100 μm to about 1,000 μm, and are preferably formed by a laser or by drilling. As a conducting material with which the via holes 10 and 11 are filled, for example, a binder that is composed of glass, a resin, or other suitable binder and that contains Cu, Ag, Ni, Au, Sn, Zn, Pd, or Pt or a mixture thereof serving as a conductive material is preferably used, the content of the conductive material being about 20% to about 90%.

The outer layer electrodes 3 and 4 and the inner layer electrode 5 are each made of, for example, a metal thin film having a thickness of about 10 μm to about 40 μm. As the electrodes 3, 4, and 5, for example, a copper foil is preferably used. The copper foil may be gold plated, tin plated, or preflux treated.

As the resin layers 1 and 2, for example, an epoxy resin including an inorganic filler is preferably used. The content of the inorganic filler is, for example, about 60% to about 95%. The inorganic filler is preferably composed of an insulating material, such as SiC, $Al_2O_3$, or AlN, and preferably has a size of, for example, about 0.1 μm to about 10 μm. In this manner, by incorporating the inorganic filler, the linear expansion coefficient of the prepreg described below is reduced, and thus, the linear expansion coefficient of the prepreg is close to the linear expansion coefficient of a wiring material defining the electrode pattern and to the linear expansion coefficient of the conductive bonding material. Furthermore, stress applied to a junction during heating is reduced. Therefore, the reliability of the junction is improved.

A process for producing the component-embedded substrate A having the structure described above will be described below according to FIG. 2. This production process corresponds to the first preferred embodiment.

Figure 2:
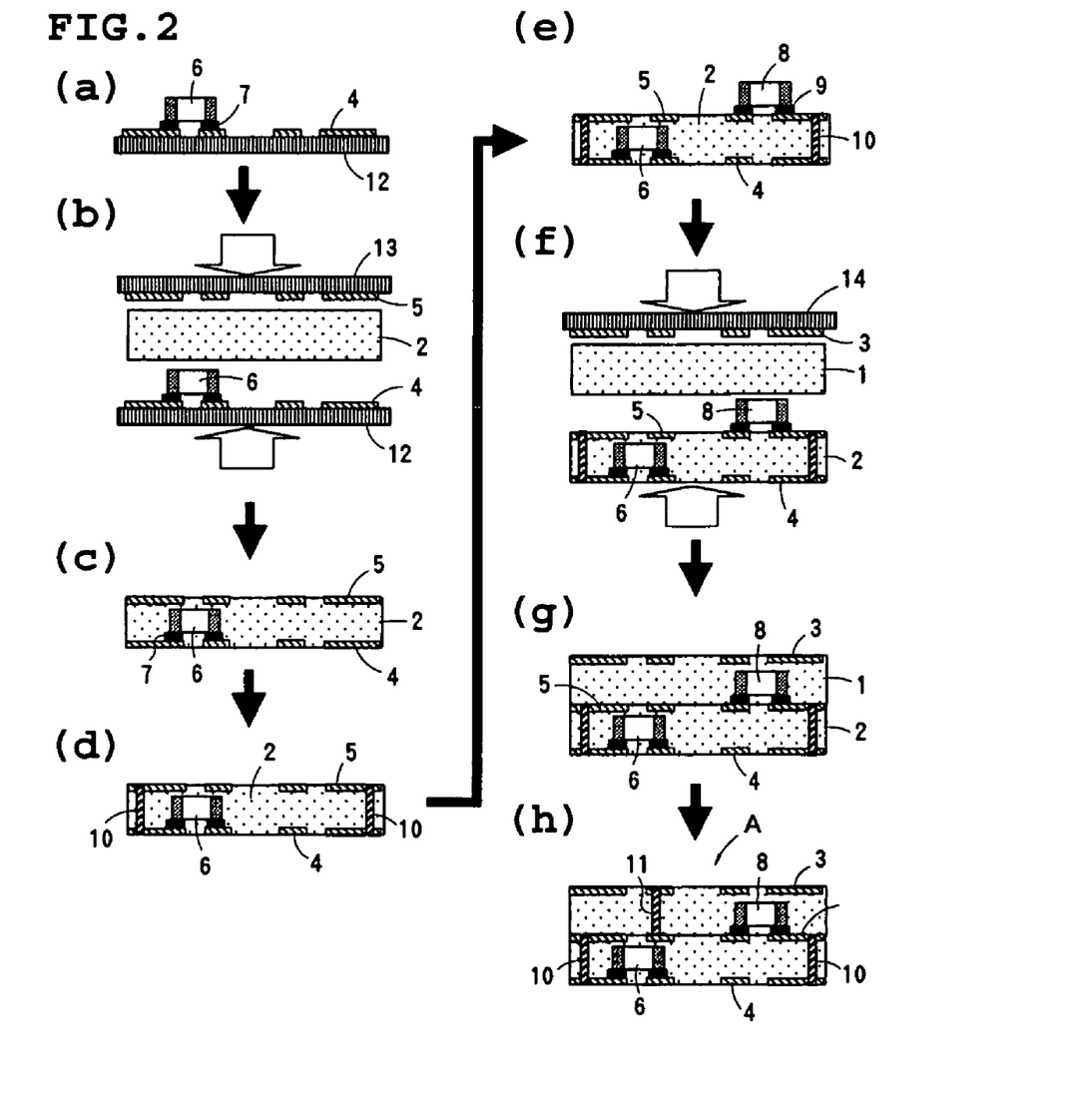
FIG. 2 is a process chart for producing the component-embedded substrate shown in FIG. 1.

In step (a), an electrode that is made of a copper foil and that is bonded onto a supporting layer 12 is etched to form a circuit pattern 4. The circuit pattern 4 may be directly formed on the supporting layer 12 by plating, evaporation, or other suitable method. The supporting layer 12 may be formed of, for example, a thin metal plate composed of stainless steel (SUS) or other suitable material and having a thickness of, for example, about 1.0 mm.

The conducting adhesive 7 is applied to a predetermined location of the electrode pattern 4. The electronic component 6 is mounted on the conductive bonding material 7 and is placed in, for example, an oven set at about 120° C. to cure the conductive bonding material 7. With respect to a method of applying the conducting adhesive 7, printing using a mesh screen or a metal mask, dispensing, or other suitable method is used. In this case, the conducting adhesive used as the conductive bonding material 7 is thermosetting, and thus, is cured in an oven. When a UV curable adhesive is used, curing is performed by UV irradiation. When a cyanoacrylate adhesive is used, curing is performed with a minute amount of water present on the surface of an adherend. When an anaerobic adhesive is used, curing is performed by blocking air (oxygen).

In step (b), another supporting layer 13 including the electrode pattern 5 provided on a surface thereof is press-bonded onto the component-mounted side of the supporting layer 12 with the prepreg 2 therebetween. At the same time, the prepreg 2 is temporarily cured. By the press-bonding, the electronic component 6 is embedded in the prepreg 2, and the electrode patterns 4 and 5 are bonded to the front and back surfaces of the prepreg 2. As the temporary curing conditions, for example, heat treatment is preferably performed at about 120° C. for about 10 to about 15 minutes. The electrode pattern 5 is formed on the supporting layer 13 by the same process as that for of electrode pattern 4. The material and shape of the supporting layer 13 are preferably identical to those of the supporting layer 12. In this manner, an electronic component is not mounted on the surface of the electrode pattern 5 but temporarily fixed.

In step (c), after thermocompression-bonding and curing of the prepreg 2, the supporting layers 12 and 13 are separated from the temporarily cured prepreg 2, thereby transferring the electrode patterns 4 and 5 onto the front and back surfaces of the prepreg 2. After the separation, the prepreg 2 is completely cured. As the complete curing conditions, for example, heat treatment is preferably performed at about 170° C. to about 200° C. for about 1 hour.

In step (d), the through hole or via hole 10 is formed in the cured resin layer 2 and is then filled with a conducting material to electrically connect the front-side electrode pattern 5 to the back-side electrode pattern 4. The via hole 10 is formed by a laser or by drilling. In this manner, since the via hole 10 is formed in the cured resin layer 2, deviations of the connection locations of the via hole 10 and the electrode patterns 4 and 5 caused by curing contraction does not occur, thus resulting in a highly precise connection structure. When the prepreg 2 is cured after separating the supporting layers 12 and 13 from the prepreg 2, it is also possible to form the via hole 10 by irradiating the uncured prepreg with a laser.

In step (e), the electronic component 8 is connected and fixed onto the electrode pattern 5 with the conductive bonding material 9, the electrode pattern 5 being provided on the front side. Also in this case, a conducting adhesive is used as the conductive bonding material 9. The conducting adhesive 9 is preferably cured in an oven set at, for example, about 120° C.

In step (f), another supporting layer 14 including the electrode pattern 3 provided on a surface thereof is press-bonded onto the surface of the resin layer 2 with the prepreg 1 therebetween, the surface fixing the electronic component 8. At the same time, the prepreg 1 is temporarily cured. By press-bonding, the electronic component 8 is embedded in the prepreg 1, and electrode patterns 5 and 3 are bonded onto the front and back surfaces of the prepreg 1. The temporary curing conditions are the same as those described above. The electrode pattern 3 is preferably formed on the supporting layer 14 by the same process as that for the electrode pattern 4. The material and shape of the supporting layer 14 are preferably identical to those of the supporting layer 12. In this case, an electronic component is not mounted on the outer layer electrode 3 but may be appropriately connected and fixed using the conductive bonding material.

In step (g), after thermocompression-bonding and curing the prepreg 1, the supporting layer 14 is separated from the temporarily cured prepreg 1, thereby transferring the electrode pattern 3 onto the surface of the prepreg 1. After separation, the prepreg is completely cured. The complete curing conditions are the same as those described above.

In step (h), the through hole or via hole 11 is formed in the cured resin layer 1 and is then filled with a conducting material to electrically connect the electrode pattern 3 with the electrode pattern 5.

Steps (a) to (h) are included in the process for producing the component-embedded substrate A having two resin layers 1 and 2. By sequentially laminating other resin layers on the outer surface of the resin layer 1 or 2, it is also possible to form a component-embedded substrate having a multilayer structure.

As shown in FIG. 2, after connecting the electronic components 6 and 8 with the electrode patterns 4 and 5 using the conductive bonding materials 7 and 9, the prepregs 2 and 1 are press-bonded, thus preventing detachment of the electronic components 6 and 8 from the electrode patterns 4 and 5 during the press-bonding of the prepregs 2 and 1, and reducing the connection resistance. Since the electrode pattern 5 interposed between the resin layers 1 and 2 is a single layer, the two resin layers 1 and 2 are securely bonded with the electrode pattern 5 provided therebetween. Therefore, delamination of the resin layers 1 and 2 from the electrode pattern 5 is eliminated.

Figure 3:
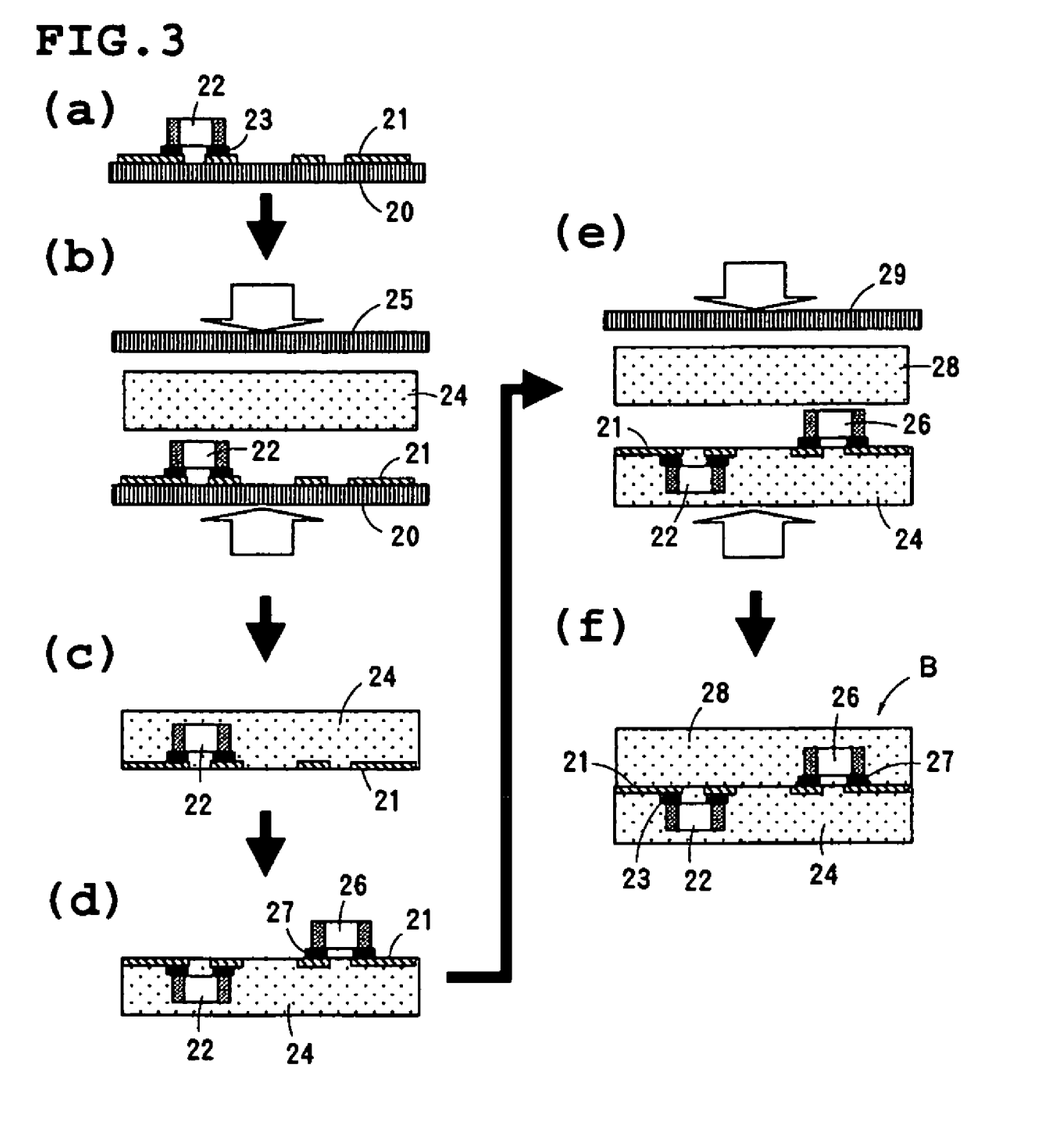
FIG. 3 is a process chart for producing the component-embedded substrate according to a second preferred embodiment of the present invention.

FIG. 3 shows a process for producing a component-embedded substrate B according to a second preferred embodiment of the present invention.

In step (a), an electrode pattern 21 is formed on a supporting layer 20, and an electronic component 22 is connected and fixed onto the surface of the electrode pattern 21 with a conductive bonding material 23. The supporting layer 20, the electrode pattern 21, and the conductive bonding material 23 are the same as those in the first preferred embodiment shown in FIGS. 1 and 2. Thus, the descriptions thereof are omitted.

In step (b), another supporting layer 25 is press-bonded onto the component-mounted surface of the supporting layer 20 with a prepreg 24 therebetween. At the same time, the prepreg 24 is temporarily cured. By press-bonding, the electronic component 22 is embedded in the prepreg 24, and the electrode pattern 21 is bonded to the lower surface of the prepreg 24. The temporary curing conditions are preferably the same as those in the first preferred embodiment.

In step (c), after thermocompression-bonding and curing the prepreg 24, the supporting layers 20 and 25 are separated from the temporarily cured prepreg 24, thereby transferring the electrode pattern 21 to the lower surface of the prepreg 24. Then, the prepreg 24 is completely cured. The complete curing conditions are preferably the same as those in the first preferred embodiment.

In step (d), the cured resin layer 24 is flipped over, and an electronic component 26 is connected and fixed onto the back surface of the electrode pattern 21 with a conductive bonding material 27.

In step (e), another supporting layer 29 is press-bonded onto the surface fixing the electronic component 26 with a prepreg 28 therebetween. At the same time, the prepreg 28 is temporarily cured. By press-bonding, the electronic component 26 is embedded in the prepreg 28, and the prepreg 28 is bonded to the electrode pattern 21. The temporary curing conditions are the same as those described above.

In step (f), after thermocompression-bonding and curing the prepreg 28, the supporting layer 29 is separated from the temporarily cured prepreg 28. After the separation, the prepreg 28 is completely cured. The complete curing conditions are the same as those in the first preferred embodiment.

As described above, the component-embedded substrate B having a two-layer structure is obtained. Next, electrode patterns are formed on the front and back surfaces of the resin layers 24 and 28, and the inner layer electrode 21 is preferably connected to the exterior by providing a through hole or a via hole.

As described above, when the electronic components 22 and 26 are connected onto the front and back surfaces of one inner layer electrode 21, the electronic components 22 and 26 are connected and fixed onto the inner layer electrode 21 with the conductive bonding materials 23 and 27, respectively. Thus, the conduction reliability between the inner layer electrode 21 and the electronic components 22 and 26 is improved, and the connection resistance is reduced.

Figure 4:
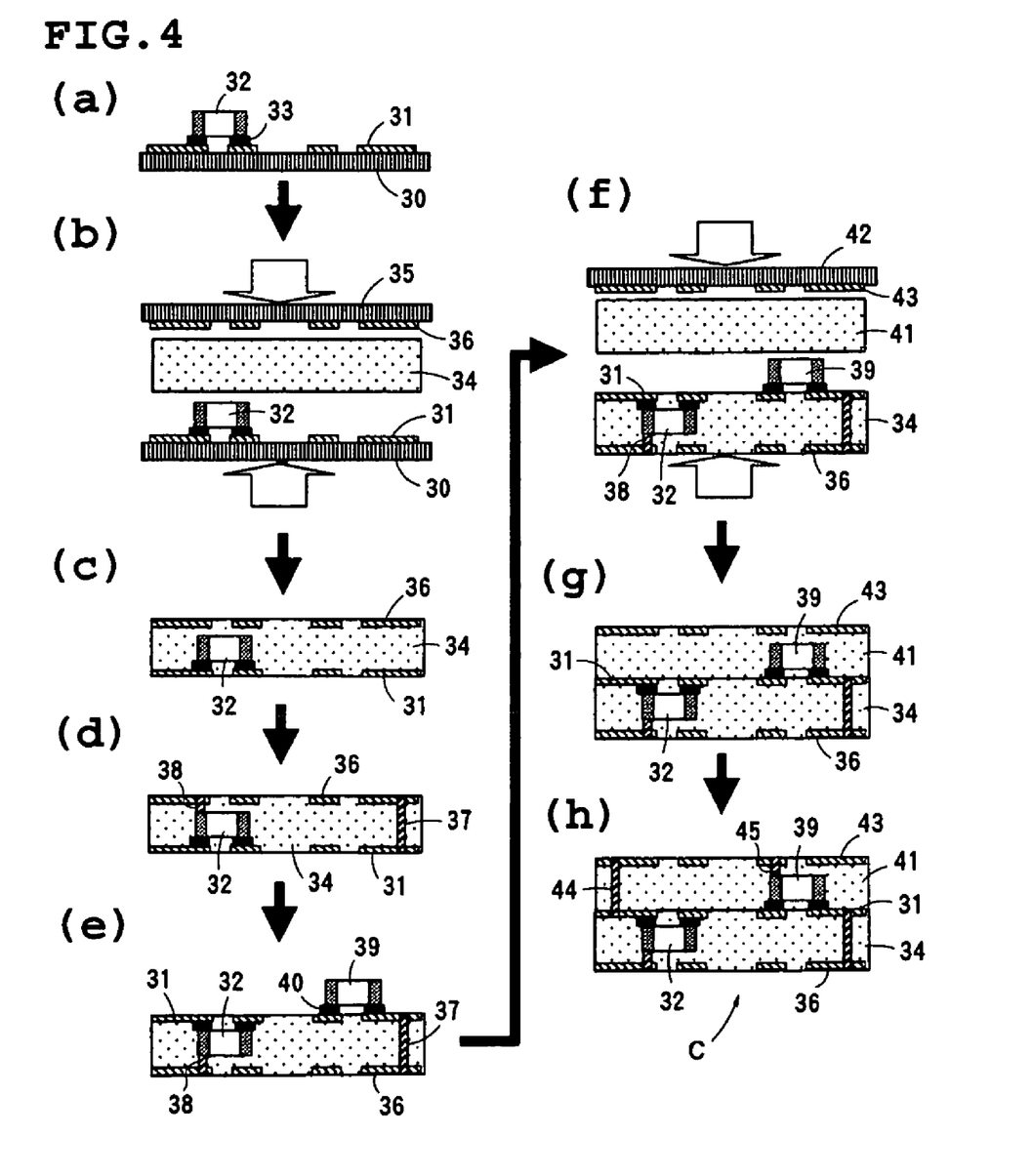
FIG. 4 is a process chart for producing the component-embedded substrate according to a third preferred embodiment of the present invention.

FIG. 4 shows a process for producing a component-embedded substrate C according to a third preferred embodiment of the present invention.

In step (a), an electrode pattern 31 is formed on a supporting layer 30, and an electronic component 32 is connected and fixed onto the surface of the electrode pattern 31 with a conductive bonding material 33. Since the supporting layer 30, the electrode pattern 31, and the conductive bonding material 33 are identical to those in the first preferred embodiment shown in FIGS. 1 and 2, the descriptions thereof are omitted.

In step (b), another supporting layer 35 including an electrode pattern 36 provided on the surface thereof is press-bonded onto the component-mounted surface of the supporting layer 30 with a prepreg 34 therebetween. At the same time, the prepreg 34 is temporarily cured. The temporary curing conditions are preferably the same as those in the first preferred embodiment.

In step (c), after thermocompression-bonding and curing the prepreg 34, the supporting layers 30 and 35 are separated from the temporarily cured prepreg 34. After separation, the prepreg 34 is completely cured. The complete curing conditions are the same as those in the first preferred embodiment.

In step (d), a through hole 37 or a via hole 38 is formed in the cured resin layer 34 and is then filled with a conducting material to electrically connect the front-side electrode pattern 31 with the back-side electrode pattern 36 and to electrically connect the electrode pattern 36 with the external electrode of the electronic component 32. The via hole 37 or 38 is formed by the same process as that in the first preferred embodiment. In this manner, since the electrode pattern 36 is electrically connected to the external electrode of the electronic component 32 through the via hole 38, the length of the via hole 38 is reduced by the thickness of the electronic component 32, and thus, the resistance of a conducting path is reduced.

In step (e), the cured resin layer 34 is flipped over, and an electronic component 39 is connected and fixed onto the back surface of the electrode pattern 31 with a conductive bonding material 40.

In step (f), another supporting layer 42 including an electrode pattern 43 provided on the surface thereof is press-bonded onto the surface fixing the electronic component 39 with a prepreg 41 therebetween. At the same time, the prepreg 41 is temporarily cured. The temporary curing conditions are the same as those in the first preferred embodiment.

In step (g), after thermocompression-bonding and curing the prepreg 41, the supporting layer 42 is separated from the temporarily cured prepreg 41. After the separation, the prepreg 41 is completely cured. The complete curing conditions are the same as those in the first preferred embodiment.

In step (h), a through hole 44 or a via hole 45 is formed in the cured resin layer 41 and is then filled with a conducting material to electrically connect the front-side electrode pattern 43 with the back-side electrode pattern 31 and to electrically connect the electrode pattern 43 with the external electrode of the electronic component 39.

In this component-embedded substrate C, in the same manner as for the component-embedded substrate B, the electronic components 32 and 39 are connected and fixed onto the front and back surfaces of one inner layer electrode 31 with conductive bonding materials 33 and 40. Therefore, the conduction reliability between the inner layer electrode 31 and the electronic components 32 and 39 is improved, and the connection resistance is reduced. Furthermore, the outer layer electrodes 36 and 43 are simultaneously formed by transfer with the press-bonding of the prepregs 34 and 41. Thus, the steps of forming the outer layer electrodes 36 and 43 are omitted.

Figure 5:
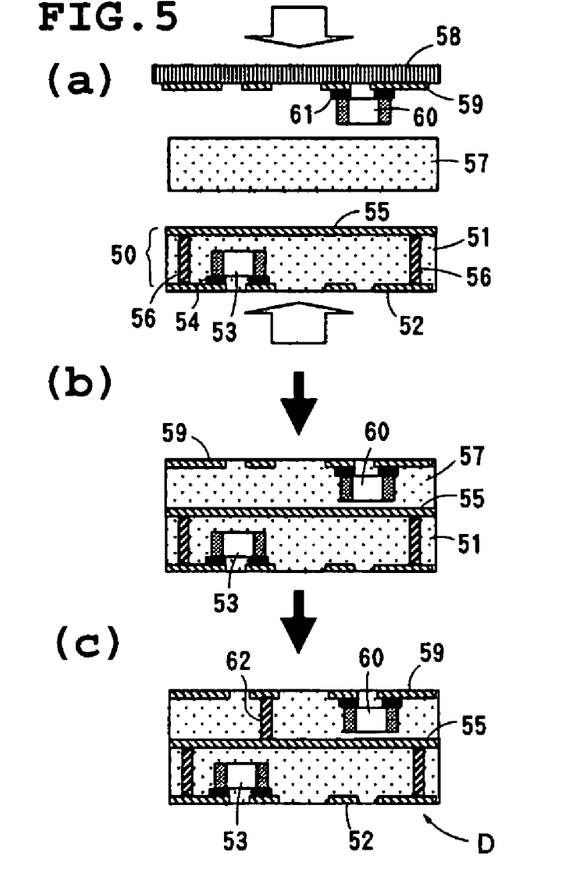
FIG. 5 is a process chart for producing the component-embedded substrate according to a fourth preferred embodiment of the present invention.

FIG. 5 shows a process for producing a component-embedded substrate D according to a fourth preferred embodiment of the present invention. This production process provides an exemplary component-embedded substrate including a shield electrode therein.

In step (a), a shield electrode 55 and an electrode pattern 52 that includes an electronic component 53 connected and fixed onto a surface thereof with a conductive bonding material 54 are transferred onto the front and back surfaces of a resin layer 51 to prepare a sheet 50. A process for producing this sheet 50 includes the same steps as, for example, steps (a) to (d) shown in FIG. 2, except that the front-side electrode is the shield electrode 55 covering substantially the entire front surface. The electrode pattern 52 is connected to the shield electrode 55 through the via hole 56.

Another supporting layer 58 including an electrode pattern 59 provided on a surface thereof is press-bonded onto the shield electrode 55 of the sheet 50 with a prepreg 57 therebetween. An electronic component 60 is connected and fixed onto the electrode pattern 59 with a conductive bonding material 61. The prepreg 57 is temporarily cured simultaneously with the press-bonding.

In step (b), the supporting layer 58 is separated. In this state, the prepreg 57 is securely bonded and fixed onto the back surface of the shield electrode 55. The electronic component 60 is embedded in the prepreg 57. At the same time, the electrode pattern 59 is transferred onto the prepreg 57. Then, the prepreg 57 is completely cured.

In step (c), a via hole 62 is formed in the cured resin layer 57 and is then filled with a conducting material to connect the shield electrode 55 with the electrode pattern 59.

As described above, since the shield electrode 55 which functions as the inner layer electrode is included, noise generated from the electronic component mounted another layer in the component-embedded substrate D and the noise of electromagnetic waves from the exterior are shielded, and satisfactory electrical characteristics are obtained. To achieve a satisfactory shielding effect, the electrode area of the shield electrode 55 must be at least about 60% and preferably at least about 90% of the single-layer area (the total of the electrode area and the non-electrode area).

Figure 6:
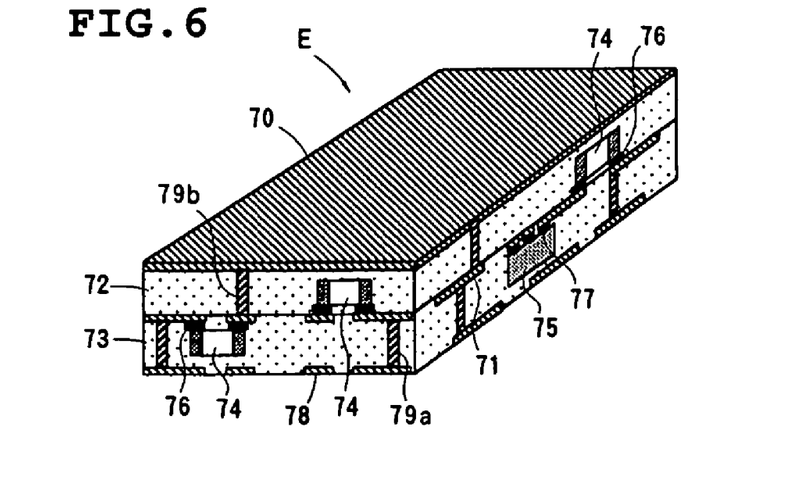
FIG. 6 is a perspective view of a component-embedded substrate according to a fifth preferred embodiment of the present invention.

FIG. 6 shows the structure of a component-embedded substrate E according to a fifth preferred embodiment of the present invention.

In this preferred embodiment, similar to the component-embedded substrate D, an example in which a shield electrode is included is provided, except that a shield electrode 70 is provided as the outer layer electrode.

In this component-embedded substrate E, two resin layers 72 and 73 are provided with an inner layer electrode 71 provided therebetween, and electronic components 74 and 75 are connected and fixed onto the front and back surfaces of the inner layer electrode 71 with conductive bonding materials 76 and 77. The electronic component 74 is a chip component mounted on the inner layer electrode 71 with solder or a conducing adhesive 76. The electronic component 75 is a bare chip mounted on the inner layer electrode 71 with a bump 77. The electrode pattern 71 is connected to a electrode pattern 78 through a via hole 79a. The shield electrode 70 is connected to the inner layer electrode 71 through a via hole 79b.

The component-embedded substrate E is produced by the same process as that shown in FIG. 4, except that the shield electrode 70 is provided in place of the electrode pattern 43.

Figure 7:
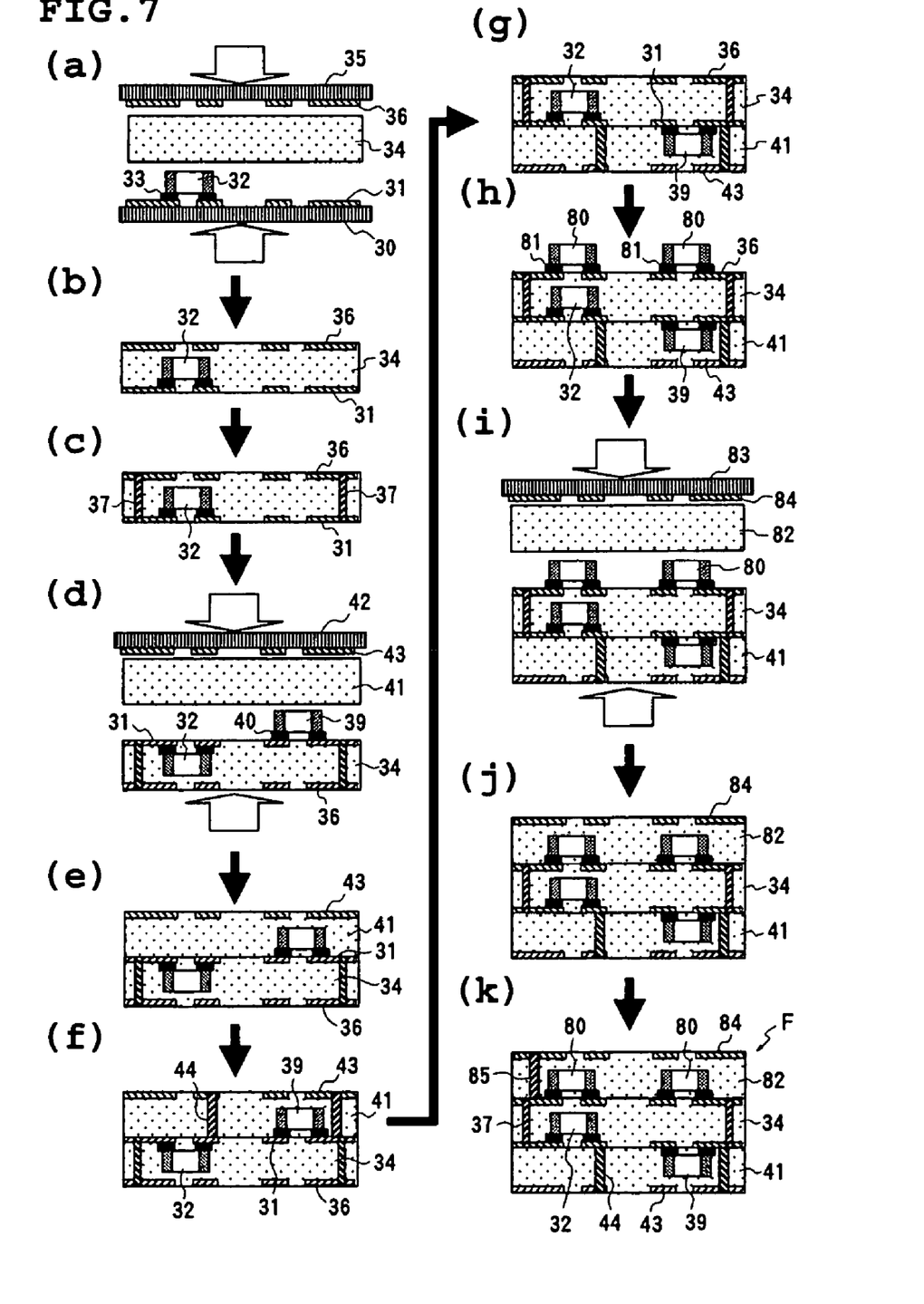
FIG. 7 is a process chart for producing the component-embedded substrate according to a sixth preferred embodiment of the present invention.

FIG. 7 shows a process for producing a component-embedded substrate F according to a sixth preferred embodiment of the present invention. This process provides an exemplary component-embedded substrate having three-layer structure.

Steps (a) to (f) are substantially identical to steps (b) to (h) in the third preferred embodiment (see FIG. 4). Thus, the same reference numerals are assigned, and descriptions thereof are omitted.

In step (g), a component-embedded substrate having a two-layer structure is flipped vertically. In step (h), an electronic component 80 is connected and fixed onto the back surface of the upper-side electrode pattern 36 with a conductive bonding material 81.

In step (i), another supporting layer 83 including an electrode pattern 84 provided on a surface thereof is press-bonded onto the surface fixing the electronic component 80 with a prepreg 82 therebetween. At the same time, the prepreg 82 is temporarily cured. That is, the prepreg 82 is press-bonded onto the surface of the first layer prepreg 34, the surface being opposite the surface bonded to the second layer prepreg 41.

In step (j), after thermocompression-bonding and curing the prepreg 82, the supporting layer 83 is separated from the temporarily cured prepreg 82.

In step (k), after the temporarily cured prepreg 82 is completely cured, a through hole or via hole 85 is formed in the resin layer 82 and is then filled with a conducting material to electrically connect the front- and back-side electrode patterns 36 and 84. Alternatively, the electrode pattern 84 may be directly connected to the electronic component 80 through the via hole 85.

In this preferred embodiment, the third layer prepreg 82 is laminated on the surface of the first layer prepreg 34, the surface being opposite the surface bonded to the second prepreg 41. The reason for this is described below.

After curing the first layer prepreg 34, when the second layer prepreg 41 is laminated and cured, the substrate having the two-layer structure is warped toward the second layer prepreg 41 because of the curing contraction of the second layer prepreg 41.

Accordingly, the third layer prepreg 82 is laminated on the surface of the first layer prepreg 34, the surface being opposite the surface bonded to the second layer prepreg 41. Thereby, the substrate that has the two-layer structure and that has been warped toward the second layer prepreg 41 can be warped in the opposite direction because of the curing contraction of the third layer prepreg 82. As a result, a substrate having a three-layer structure and having a low warpage is produced.

In the above-described preferred embodiments, the electronic components are preferably connected and fixed onto the electrode patterns with the conducting adhesives. Alternatively, solder may be used, and lead-free solder is preferably used in view of environmental concerns. For example, Sn including one to four elements selected from Ag, Bi, Cu, Zn, and In is preferably used.

With respect to the conducting adhesive, a binder that is composed of epoxy or urethane and that includes Ag, Cu, Ni, Au, Sn, Zn, or Pt serving as a conductive material or a mixture of these may be used.

In the above-described preferred embodiments, the prepreg is temporarily cured before separating the supporting layer, and the prepreg is completely cured after separating the supporting layer. Alternatively, the prepreg may be completely cured before separating the supporting layer.

As is clear from the descriptions above, according to the first preferred embodiment of the present invention, a plurality of layers are not laminated in a single step. By sequentially laminating the prepregs and the electrode patterns, it is possible to produce a component-embedded substrate having a multilayer structure.

Therefore, the electrode pattern can be connected to the electronic component with the conductive bonding material. The connection resistance between the electrode pattern and the electronic component is reduced. The connection reliability is greatly improved.

Furthermore, the inner layer electrode between the prepregs (resin layers) is a single layer and is different from a structure having two inner layer electrodes. Therefore, it is unnecessary to contact and electrically connect the inner layer electrodes to each other. Furthermore, it is possible to prevent the occurrence of delamination between the inner layer electrodes.

The electrode pattern is transferred to the prepreg, and after curing this prepreg, the next prepreg is laminated. Thus, the first prepreg is not compressed during every lamination, and there are no problems, such as the poor electrical connection of the electrical component embedded in the first prepreg or the deformation of the electrode pattern.

According to the second preferred embodiment, in the case in which the electronic components are connected onto the front and back surfaces of the inner layer electrode, the first electronic component is connected and fixed onto the surface of the first electrode pattern with the conductive bonding material, and the first electrode pattern is transferred to the prepreg. Then, the second electronic component is connected and fixed onto the back surface of the first electrode pattern with the conductive bonding material, and another prepreg is press-bonded onto the back surface of the first electrode pattern.

Therefore, high conduction reliability between the first electrode pattern defining the inner layer electrode and the electronic components is achieved and the connection resistance is reduced. As a result, a component-embedded substrate having reliable electrical characteristics is produced.

According to the third preferred embodiment, in the case in which the electronic components are connected onto the front and back surfaces of the inner layer electrode, the supporting layer having the electrode pattern is disposed on the surface opposite the press-bonded surface of the prepreg, and then the electrode pattern is transferred simultaneously with press-bonding. Therefore, in addition to an effects obtained in the second preferred embodiment, it is unnecessary to form a new electrode pattern after press-bonding the prepreg. Thus, the number of steps is reduced.

While the present invention has been described with respect to preferred embodiments thereof, it will be apparent to those skilled in the art that the disclosed invention may be modified in numerous ways and may assume many embodiments other than those specifically set out and described above. Accordingly, it is intended by the appended claims to cover all modifications of the invention which fall within the true spirit and scope of the invention.

The invention claimed is:

1. A process for producing a component-embedded substrate, comprising steps of:
    connecting and fixing a first electronic component to a first electrode pattern on a first supporting layer with a conductive bonding material;
    press-bonding a second supporting layer including a second electrode pattern onto the electronic component-fixed surface of the first supporting layer with a first prepreg therebetween to perform transfer;
    separating the first supporting layer and the second supporting layer from the first prepreg such that the first and second electrode pattern are disposed on a front surface and a back surface of the first prepreg;
    curing the first prepreg before or after the step of separating the first supporting layer and the second supporting layer from the first prepreg;
    connecting and fixing a second electronic component onto a back surface of the second electrode pattern with a conductive bonding material after the step of curing the first prepreg;
    press-bonding a third supporting layer including a third electrode pattern onto a second electronic component-fixed surface with a second prepreg therebetween to perform transfer;
    separating the third supporting layer from the second prepreg; and
    curing the second prepreg before or after the step of separating the third supporting layer from the second prepreg, wherein the prepregs and the electrode patterns are sequentially laminated; wherein
    the step of curing the first prepreg further comprises substeps of:
    performing temporary curing before separating the first and second supporting layers from the first prepreg; and
    performing complete curing after separating the first and second supporting layers from the first prepreg.

2. The process for producing the component-embedded substrate according to claim 1, further comprising the steps of:
    forming a through hole in the first prepreg which extends in a thickness direction of the first prepreg after curing the prepreg; and
    forming a conducting path inside the through hole, the conducting path electrically connecting the first and second electrode patterns provided on the front surface and the back surface of the first prepreg.

3. the process for producing the component-embedded substrate according to claim 1, further comprising the steps of:
    forming a through hole in the first prepreg connecting the electrode pattern provided on the front surface or the back surface of the first prepreg with an external electrode of the first electronic component after curing the first prepreg; and
    forming the conducting path inside the through hole, the conducting path electrically connecting the electrode pattern with the external electrode of the first or second electronic component.

4. The process for producing the component-embedded substrate according to claim 1, further comprising the steps of:
    press-bonding a fourth supporting layer having a fourth electrode pattern onto the surface of the first prepreg with a third prepreg therebetween to perform transfer, the surface being opposite the surface bonded to the second prepreg;
    separating the fourth supporting layer from the third prepreg; and
    curing the third prepreg before or after the step of separating the fourth supporting layer from the third prepreg.

5. A process for producing a component-embedded substrate, comprising steps of:
    connecting and fixing a first electronic component to a first electrode pattern on a first supporting layer with a conductive bonding material;
    press-bonding a second supporting layer including a second electrode pattern onto the electronic component-fixed surface of the first supporting layer with a first prepreg therebetween to perform transfer;
    separating the first supporting layer and the second supporting layer from the first prepreg such that the first and second electrode patterns are disposed on a front surface and a back surface of the first prepreg;
    curing the first prepreg before or after the step of separating the first supporting layer and the second supporting layer from the first prepreg;
    connecting and fixing a second electronic component onto a back surface of the second electrode pattern with a conductive bonding material after the step of curing the first prepreg;
    press-bonding a third supporting layer including a third electrode pattern onto a second electronic component-fixed surface with a second prepreg therebetween to perform transfer;
    separating the third supporting layer from the second prepreg; and
    curing the second prepreg before or after the step of separating the third supporting layer from the second prepreg, wherein the prepregs and the electrode patterns are sequentially laminated; wherein
    the step of curing the second prepreg further comprises substeps of:
    performing temporary curing before separating the third supporting layer from the second prepreg; and
    performing complete curing after separating the third supporting layer from the second prepreg.

6. The process for producing the component-embedded substrate according to claim 5, further comprising the steps of:
forming a through hole in the first prepreg which extends in a thickness direction of the first prepreg after curing the prepreg; and
forming a conducting path inside the through hole, the conducting path electrically connecting the first and second electrode patterns provided on the front surface and the back surface of the first prepreg.

7. The process for producing the component-embedded substrate according to claim 5, further comprising the steps of:
forming a through hole in the first prepreg connecting the electrode pattern provided on the front surface or the back surface of the first prepreg with an external electrode of the first electronic component after curing the first prepreg; and
forming the conducting path inside the through hole, the conducting path electrically connecting the electrode pattern with the external electrode of the first or second electronic component.

8. The process for producing the component-embedded substrate according to claim 5, further comprising the steps of:
press-bonding a fourth supporting layer having a fourth electrode pattern onto the surface of the first prepreg with a third prepreg therebetween to perform transfer, the surface being opposite the surface bonded to the second prepreg;
separating the fourth supporting layer from the third prepreg; and
curing the third prepreg before or after the step of separating the fourth supporting layer from the third prepreg.

* * * * *

UNITED STATES PATENT AND TRADEMARK OFFICE
CERTIFICATE OF CORRECTION

PATENT NO.        : 7,608,477 B2                                   Page 1 of 1
APPLICATION NO. : 10/560223
DATED             : October 27, 2009
INVENTOR(S)       : Haruhiko Ikeda It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 422 days.

Signed and Sealed this

Twelfth Day of October, 2010

David J. Kappos
*Director of the United States Patent and Trademark Office*